(12) United States Patent
Bertram et al.

(10) Patent No.: US 11,476,384 B2
(45) Date of Patent: Oct. 18, 2022

(54) PLANAR SEMICONDUCTOR LIGHT SOURCE COMPRISING DOWNSTREAM OPTICAL ELEMENT

(71) Applicant: OSRAM OLED GMBH, Regensburg (DE)

(72) Inventors: Ralph Peter Bertram, Herzogenrath (DE); Norbert Harendt, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/760,333

(22) PCT Filed: Dec. 11, 2018

(86) PCT No.: PCT/EP2018/084338
§ 371 (c)(1),
(2) Date: Apr. 29, 2020

(87) PCT Pub. No.: WO2019/121161
PCT Pub. Date: Jun. 27, 2019

(65) Prior Publication Data
US 2020/0350461 A1  Nov. 5, 2020

(30) Foreign Application Priority Data
Dec. 19, 2017  (DE) ............... 10 2017 130 578.5

(51) Int. Cl.
*H01L 33/00* (2010.01)
*H01L 33/58* (2010.01)
(Continued)

(52) U.S. Cl.
CPC .......... *H01L 33/0093* (2020.05); *H01L 33/58* (2013.01); *F21V 23/04* (2013.01); *F21Y 2115/10* (2016.08)

(58) Field of Classification Search
CPC ........................... H01L 33/0093; H01L 33/58
See application file for complete search history.

(56) References Cited

U.S. PATENT DOCUMENTS 6,556,439 B2    4/2003   Shibaski
10,139,217 B1 *  11/2018  Holt .................. G01B 11/2513
(Continued)

FOREIGN PATENT DOCUMENTS

DE    10201621047 A1   12/2017
DE    102016210147 A1   12/2017
(Continued)

OTHER PUBLICATIONS

Messer W.: "Osram—"OmniPoint"—die Zukunft der flexiblen LED-Beleuchtung (Update)?" 12. Mai 2015, http://fastvoice.net/2015/05/12/osram-omnipoint-die-zukunft-der-flexiblen-led-beleuchtung/.
(Continued)

*Primary Examiner* — Jay C Chang
*Assistant Examiner* — Mikka Liu
(74) *Attorney, Agent, or Firm* — Arentfox Schiff LLP (57) ABSTRACT

A light source is specified which comprises a planar semiconductor light source comprising a plurality of independently operable single emitters, wherein, during operation, each of the single emitters emits light via respective single luminous surface. Furthermore, the light source has a common optical element which is arranged directly downstream of the single emitters and which is embodied and intended to direct light from different single emitters into different solid angle regions, wherein the single emitters are arranged defocused with respect to the optical element and the individual light surfaces are imaged in a blurred manner by the optical element.

19 Claims, 10 Drawing Sheets

(51) Int. Cl.
*F21Y 115/10* (2016.01)
*F21V 23/04* (2006.01)

(56) References Cited

U.S. PATENT DOCUMENTS

| | | | | |
|---|---|---|---|---|
| 2011/0080742 A1* | 4/2011 | Allen | .................... | F21K 9/232 |
| | | | | 362/294 |
| 2011/0305021 A1* | 12/2011 | Xin | ..................... | H01L 33/58 |
| | | | | 362/249.02 |
| 2015/0211708 A1 | 7/2015 | Staveley et al. | | |
| 2015/0325598 A1 | 11/2015 | Pfeuffer et al. | | |
| 2015/0333047 A1 | 11/2015 | Pfeuffer | | |
| 2016/0091173 A1* | 3/2016 | Camp, III | ............... | F21V 13/04 |
| | | | | 362/242 |
| 2017/0359883 A1* | 12/2017 | Ansari | ................. | F21V 23/005 |

FOREIGN PATENT DOCUMENTS

| | | |
|---|---|---|
| JP | 2017021968 A | 1/2017 |
| WO | 02052335 A2 | 7/2002 |
| WO | 2014147505 A1 | 9/2014 |

OTHER PUBLICATIONS

OSRAM: "Osram presents lighting innovations at the Light + Building Preview" Feb. 2, 2016 https://www.osramgroup.com/en/media/pressreleases/pr-2016/02-02-2016.
International Search Report in corresponding international application PCT/EP2018/084338 dated Mar. 4, 2019.

* cited by examiner

PLANAR SEMICONDUCTOR LIGHT SOURCE COMPRISING DOWNSTREAM OPTICAL ELEMENT

This application is a 35 U.S.C. § 371 National Phase of PCT Application No. PCT/EP2018/084338, filed Dec. 11, 2018, which claims priority to German Application No. 10 2017 130 578.5, filed Dec. 19, 2017, the disclosures of which are hereby incorporated by reference herein.

A light source is specified.

This patent application claims the priority of the German patent application 10 2017 130 578.5, the disclosure content of which is hereby included by reference.

Light sources that can be flexibly adapted to the wishes and needs of users, also known as "smart lighting", are finding more and more applications, not only in the industrial sector but also in general lighting. For example, lighting devices are known whose emitted light intensity or light color can be adjusted depending on external parameters such as ambient brightness or the time of day. Headlamps are known from the automotive sector whose illumination field can be changed according to the course of the road or depending on oncoming vehicles.

In the case of lighting devices for general lighting, in contrast to automotive applications, no sharp lighting limits are desired. Instead, it is necessary to create smooth transitions between illuminated and unilluminated regions. Furthermore, the distances to the objects to be illuminated in general lighting are usually much smaller than in automotive applications. Accordingly, lighting devices used in general lighting, which can be used to illuminate different areas of a room, are therefore typically implemented using a large number of single spots with individually assigned lenses and reflectors, which makes compact design more difficult.

At least one object of particular embodiments is to provide a light source.

This object is achieved by a subject-matter according to the independent claim. Advantageous embodiments and developments of the subject-matter are characterized in the dependent claims, and are also disclosed by the following description and the drawings.

According to an embodiment, a light source comprises a semiconductor light source which is intended and embodied to generate light during operation. For example, the semiconductor light source may have a semiconductor layer sequence with at least one active region for generating light.

According to a further embodiment, the semiconductor light source has a plurality of single emitters operable independently of one another, wherein each of the single emitters can be operated independently of the other single emitters for light generation and emits light over a respective single luminous surface during operation. In particular, the single emitters form a coherent compound, so that the semiconductor light source comprising the single emitters forms a coherent component.

According to a further embodiment, the semiconductor light source is embodied planar. This can mean in particular that the single luminous surfaces are in the same plane or at least essentially in the same plane. The latter can mean that the single luminous surfaces can protrude from said plane, for example due to manufacturing tolerances. Such a planar and thus flat embodiment of the semiconductor light source can achieve a simple, compact construction, which can result in lower costs.

According to a further embodiment, the light source has an optical element. The optical element is intended and embodied in particular for directing light emitted by the semiconductor light source into an illumination field during operation. In other words, the optical element serves to shape the spatial radiation characteristic of the light source. In particular, the entire light source comprises exactly one optical element intended for beam shaping, which is arranged downstream of the totality of the single emitters. Accordingly, the light source can be free of further optical elements such as collimating optics, reflectors, mirrors and lens systems in addition to the optical element. In particular, the optical element can thus be arranged downstream of the semiconductor light source and thus of the plurality of single emitters in common and thus be a common optical element, particularly preferably the only optical element of the light source, arranged directly downstream of the single emitters. Furthermore, the light source can be correspondingly free of one or more optical elements individually assigned to single emitters. With regard to the functions light generation and light control, the light source can thus consist of the semiconductor light source and the optical element. In addition, the light source can comprise mechanical, electrical and electronic components and elements.

According to a further embodiment, the optical element is intended and embodied to direct light from different single emitters into different solid angle regions. Thus, with the aid of the preferably only optical element of the light source, which is arranged downstream of all single emitters of the light source, different room areas can be illuminated by a specific selection of single light sources. By a time-variable selection of single light sources, light can be brought into different regions of a room in a time-variable manner. The light source can thus form an adaptive light source that can illuminate different regions of a room with different brightness over time.

According to a further embodiment, the single emitters are arranged defocused to the optical element. The single emitters and the optical element are thus aligned to each other in such a way that the optical element does not produce a sharp image of the semiconductor light source. Rather, the single emitters and the optical element are arranged to each other in such a way that the single luminous surfaces are not sharply imaged. This allows soft brightness transitions to be produced and, if necessary, color and/or brightness fluctuations of light emitted by the single light sources to be compensated.

In the lateral direction, i.e. parallel to a main extension plane of the single luminous surfaces of the single emitters, the single emitters are arranged side by side. By activating all single emitters simultaneously, the entire lighting region can be illuminated. Parts of the lighting region illuminated by adjacent single emitters can overlap partially, especially at the blurred edges.

According to at least one embodiment, the light source comprises a control device. The control device is intended and embodied in particular for operating the single emitters. By means of the control device, which can be at least partially integrated into the semiconductor light source, the single emitters can be operated independently of one another and in particular also simultaneously with different currents and/or different voltages. For example, the control device has at least one active matrix circuit in which at least two single emitters, in particular all single emitters, can be driven simultaneously. For example, each single emitter of the semiconductor light source is assigned a switch of the control device, such as a transistor.

According to a further embodiment, the single emitters are arranged in a matrix arrangement. In particular, the individual elements of the matrix arrangement can be controlled independently of each other. The term "matrix arrangement" generally refers to a two-dimensional arrangement of a number of single emitters, for example in a regular square, rectangular or hexagonal grid. Accordingly, the single emitters can be arranged particularly preferably in an orthogonal matrix or in a hexagonal matrix. Here, the single emitters can have single luminous surfaces, preferably with a square, rectangular or hexagonal shape.

According to a further embodiment, each of the single emitters comprises a single luminous surface of less than or equal to 2 mm$^2$ or preferably less than or equal to 1 mm$^2$ or particularly preferably less than or equal to 0.6 mm$^2$. Each of the single emitters can have an essentially Lambertian radiation characteristic. Accordingly, the semiconductor light source has a total luminous surface which is formed by the entirety of the single luminous surfaces, preferably arranged in a matrix. Particularly preferably, the total luminous surface has an extension of less than or equal to 2 cm in all lateral directions; accordingly, the total luminous surface can be particularly preferably less than or equal to 2 cm×2 cm. The total luminous surface can preferably have a square, rectangular, hexagonal or other polygonal shape.

According to a further embodiment, the semiconductor light source comprises or is formed by a light-emitting semiconductor chip with a plurality of independently operable luminous segments. Here, each single emitter can preferably be formed by a luminous segment of such a segmented semiconductor chip. Alternatively, it can also be possible for the semiconductor light source to comprise or be formed of a plurality of light-emitting semiconductor chips, wherein the semiconductor chips can be operated independently of one another and each single emitter is formed by a semiconductor chip. In particular, the plurality of semiconductor chips can be mounted and electrically connected on a common connection carrier such as a printed circuit board. Furthermore, the plurality of the semiconductor chips can be laterally surrounded by a common molding body, in particular a plastic body which can be produced by a molding process, the molding body being molded onto the semiconductor chips and forming a plate-type composite carrier in which the semiconductor chips are arranged.

A semiconductor material based on a nitride, phosphide or arsenide compound semiconductor material is suitable for generating light in the visible spectral range for the one or more semiconductor chips. For long-wave, infrared to red radiation for example a semiconductor material based on $In_xGa_yAl_{1-x-y}As$ is suitable, for red to green radiation for example a semiconductor material based on $In_xGa_yAl_{1-x-y}P$ is suitable, and for shorter-wave visible radiation, i.e. especially for green to blue radiation, and/or for UV radiation for example a semiconductor material based on $In_xGa_yAl_{1-x-y}N$, wherein $0 \leq x \leq 1$ and $0 \leq y \leq 1$ apply respectively.

For the generation of white light, it can also be advantageous if the single emitters comprise a wavelength conversion element arranged on the respective single luminous surface. A wavelength conversion element can be arranged downstream of a single luminous surface, a group of single luminous surfaces or all single luminous surfaces together. It can be particularly advantageous if the single emitters comprise the respective or common wavelength conversion element directly on the single luminous surface. The wavelength conversion element of each of the single emitters can comprise at least one or more wavelength conversion materials which are suitable for at least partially converting the light emitted by the single emitter during operation into light of a different wavelength, so that the single emitters can each emit a mixed light of the light primarily emitted by the semiconductor material and the converted secondary light or, in the case of a complete conversion, essentially the converted light. For example, the wavelength conversion material or materials can include one or more of the following: rare earth and alkaline earth metals, nitrides, nitride silicates, sions, sialons, aluminates, oxides, halophosphates, orthosilicates, sulphides, vanadates and chlorosilicates. Furthermore, the wavelength conversion material(s) can additionally or alternatively comprise an organic material which can be selected from a group comprising perylenes, benzopyrenes, coumarins, rhodamines and azo dyes. Furthermore, quantum dot based phosphors are also possible and advantageous. These can be formed from particles of a few nanometers in size, for example based on CdSe, CdS, CdTe, InP, InAs, Cl(Zn)S, AlS, $Zn_3N_2$, Si, ZnSe, ZnO, GaN or combinations thereof. For example, the wavelength conversion material(s) can be contained in a transparent matrix material, which can be formed by a plastic such as silicone, a glass, a ceramic material or a combination thereof. This can form a so-called phosphor platelet. Furthermore, the wavelength conversion material(s) can be deposited on a transparent substrate, such as a glass or ceramic substrate. Furthermore, it is also possible for a ceramic wavelength conversion material to form a self-supporting ceramic component. The wavelength conversion element can, for example, be attached to the single luminous surface of a single emitter by means of a suitable bonding layer, such as an adhesive layer, or it can be applied directly to the single luminous surface. The wavelength conversion element(s) are particularly preferably embodied in such a way that the single emitters all emit light of the same color during operation.

According to a further embodiment, all single luminous surfaces are embodied to be the same, in particular of the same size. Alternatively, at least two or more single emitters can have different single luminous surfaces. In particular, at least two or more single emitters can have single luminous surfaces of different sizes. For example, the entirety of the single emitters can form a total luminous surface with a central point, wherein at least one first single emitter is arranged at a first distance from the central point and at least one second single emitter is arranged at a second distance from the central point, and the first and second single emitters have single luminous surfaces of different sizes. Here, the first distance can be smaller than the second distance so that the first single emitter can have a larger single luminous surface than the second single emitter. An inverse arrangement is also possible. Furthermore, it is possible that there is a first group with a plurality of first single emitters and a second group with a plurality of second single emitters to which the above applies.

According to a further embodiment, the optical element comprises one or more lenses, wherein the totality of all lenses is embodied in such a way that the light directing properties described above are achieved. In particular, the optical element can be a refractive optical element which, with regard to its optical properties, consists of one or more lenses. In other words, there are preferably no other optical components in addition to the one or more lenses, so that the optical properties of the optical element are determined by the one or more lenses alone. The one or more lenses can be selected from lenses with one or two optical surfaces, which are selected from concave and convex as well as spherical and aspherical surfaces. Furthermore, the one or more lenses can comprise or be made of glass and/or plastic such as polymethyl methacrylate (PMMA) or cyclo-olefin polymers, for example available under the brand name Zeonex.

If the optical element has more than one lens, the several lenses can, for example, comprise different shapes and/or materials.

The optical element can be embodied in such a way that the light of each single emitter is directed into a respective solid angle region and the solid angles assigned to the single emitters are all, in pairs, at least partially different. In other words, the light of each single emitter is directed into a specially assigned solid angle region and each solid angle region overlaps at most partially with each of the other solid angle regions. If the light source is used to illuminate a surface, for example a flat surface, each single emitter can be used to illuminate a different region of the surface. In particular, the optical element can, for this purpose, at least partially have a wide-angle optical system and/or a fisheye optical system. Particularly preferably all solid angle regions have a substantially equal size. This can mean in particular that the sizes, i.e. the solid angles, of the solid angle regions differ from one another by less than 20% or less than 10% or less than 5%. With regard to the illuminated surface in question, this means that each of the single emitters can illuminate an associated area region on the surface and the area regions have substantially the same size.

According to a further embodiment, the optical element emits the total luminous surface of the semiconductor light source, i.e. the light of all jointly operated single light sources, in a light cone with a full aperture angle of greater than or equal to 60° and less than or equal to 160°. The size of the aperture angles and the solid angles described above can be given in particular in each case by the full half-width of the radiated light intensity. An aperture angle of greater than or equal to 90° is particularly preferred. Furthermore, the aperture angle can preferably be smaller than or equal to 120°, which corresponds to the glare limit of ceiling luminaires.

In order to achieve a most efficient light incoupling into the optical element, the optical element has a light-incoupling surface which can preferably have a distance of greater than or equal to 0.1 mm or greater than or equal to 1 mm or greater than or equal to 2 mm and less than or equal to 10 mm or less than or equal to 4 mm to the single luminous surfaces of the single emitters. Furthermore, the optical element, i.e. in particular the light-incoupling surface, can have an acceptance angle of greater than or equal to 60°.

According to a further embodiment, the optical element directs the total luminous surface into an illumination region, wherein the total luminous surface and the illumination region have the same shape. In other words, the total luminous surface and the illuminating region can each have a square, rectangular, hexagonal or other polygonal shape, for example. Since the single emitters are preferably arranged defocused relatively to the optical element and the single luminous surfaces are correspondingly preferably blurred, an identical shape can also mean that the shape of the illumination region is preferably blurred compared to the total luminous surface. Alternatively, the total luminous surface and the illumination region can have different shapes. For this purpose, the optical element can, for example, have one or more cylindrical lenses or lenses with a cylindrical-lens-like imaging pattern, so that light from a square total luminous surface, for example, is directed into an elliptical or rather rectangular illumination region.

The light source described here can be used, for example, for lighting purposes where spatially variable lighting accents are to be set, for example for office, restaurant, museum, reading light, shop window and shop lighting purposes.

Further advantages, advantageous embodiments and further developments are revealed by the embodiments described below in connection with the figures, in which:

FIGS. 2A to 3C show schematic illustrations of single emitters and semiconductor light sources according to further embodiments, FIGS. 5A to 6 show schematic illustrations of light sources according to further embodiments.

In the embodiments and figures, identical, similar or identically acting elements are provided in each case with the same reference numerals. The elements illustrated and their size ratios to one another should not be regarded as being to scale, but rather individual elements, such as for example layers, components, devices and regions, may have been made exaggeratedly large to illustrate them better and/or to aid comprehension.

When in the figures pluralities of the same elements with the same reference numerals are shown, it is possible that not all of these same elements are provided with reference numerals for reasons of clarity.

Figure 1:
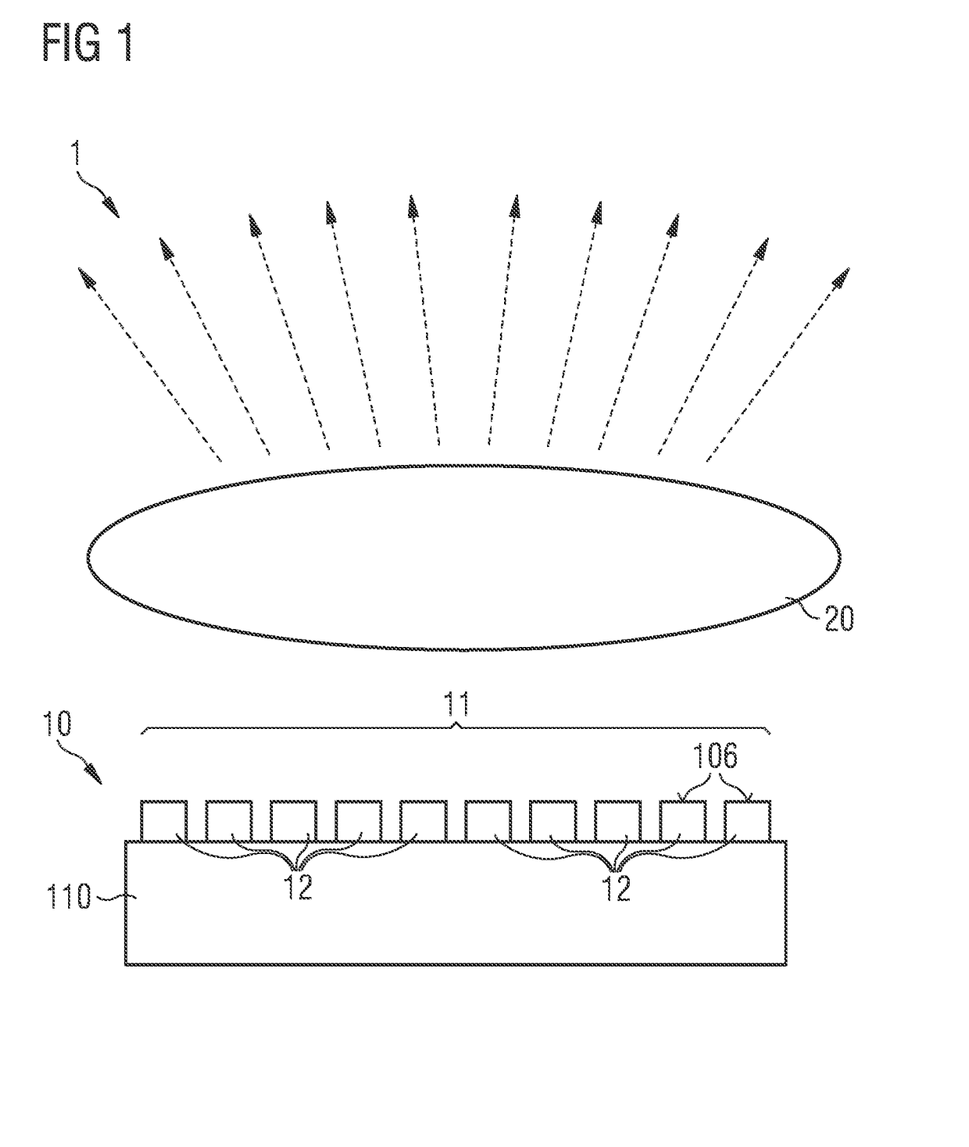
FIG. 1 shows a schematic illustration of a light source according to an embodiment.

FIG. 1 shows an embodiment of a light source 1, which comprises a semiconductor light source 10 and an optical element 20.

The semiconductor light source 10, which has a total luminous surface 11 for light emission, comprises a plurality of single emitters 12 which can be operated independently of one another, each of the single emitters 12 being able to be operated independently of the other single emitters 12 for light generation and, in operation, emitting light over a respective single luminous surface 106. In particular, the single emitters 12 form a coherent compound, so that the semiconductor light source 10, comprising the single emitters 12, forms a coherent component. The total luminous surface 11 is formed by the entirety of the single luminous surfaces 106, which are arranged laterally next to each other. Since the single emitters 12 can be operated independently of one another, the semiconductor light source 10 can variably emit light from different regions of the total luminous surface 11. In particular, the semiconductor light source 10 is embodied to be flat, i.e. with a flat overall luminous surface 11. This is achieved by the fact that the single luminous surfaces 106 lie in the same plane or at least substantially in the same plane, i.e. they project from said plane at most, for example, due to manufacturing tolerances.

The single emitters 12 can be operated with a control device 110 which, as indicated in FIG. 1, can simultaneously form a carrier for the single emitters 12. Alternatively, the control device can also form a separate component, while the single emitters 12 are arranged on a suitable connection carrier, for example. Further embodiments and features concerning the semiconductor light source 10 are described in connection with further figures.

By means of the control device 110, the single emitters 12 are operated independently of each other with specifically selected currents and/or voltages, so that at a certain point in time, for example, individual single emitters 12 and/or groups of single emitters 12 or even all single emitters 12 can be specifically operated for light generation in order to achieve a desired room illumination. For example, the control device 110 has at least one active matrix circuit by which the single emitters 12 can be controlled independently of one another.

The optical element 20 is intended and embodied to direct light emitted by the semiconductor light source 10 during operation into an illumination field as indicated by the dotted arrows. In particular, the entire light source 1 has exactly one optical element 20, which is arranged downstream of the entirety of all single emitters 12. Accordingly, the light source 1 is free of further optical elements. The single emitters 12 are also free of optical elements such as beam shaping elements, so that the single emitters 12 can each emit light with a Lambertian radiation characteristic or with an essentially Lambertian radiation characteristic.

The optical element 20 is especially intended and embodied to direct light from different single emitters 12 into different solid angle regions. Thus, the optical element 20 can be used to illuminate different room regions by a specific selection of single light sources 12. By a time-variable selection of single light sources 12, light can be directed in different directions and thus into different regions of a room to be illuminated. The light source 1 is therefore an adaptive light source that can illuminate different regions of a room with different brightness over time.

The single emitters 12 are arranged defocused to the optical element 20, so that the optical element 20 does not produce a sharp image of the semiconductor light source 10. Instead, the single emitters 12 and the optical element 20 are arranged in relation to each other in such a way that the single luminous surfaces 106 are imaged in a blurred manner. By such a slight defocusing, directed "spots" can be generated in a large range of spatial directions. In addition, soft brightness transitions can be produced and, if necessary, color and/or brightness fluctuations of light emitted by the single light sources can be compensated.

The optical element 20, for which further features are described in connection with the following figures, is also embodied in such a way that the total luminous surface 11 of the semiconductor light source 10, i.e. the light of all jointly operated single light sources 12, can be emitted in a light cone which has a full aperture angle preferably greater than or equal to 60° and less than or equal to 160°. An aperture angle of greater than or equal to 90° is particularly preferred. Furthermore, the aperture angle is preferably smaller or equal to 120°, which corresponds to the glare limit of ceiling luminaires.

In connection with the following figures, further features for the light source 1 are described using further embodiments. FIGS. 2A to 2D show embodiments of semiconductor light sources 10 and single emitters 12.

Figure 2A:
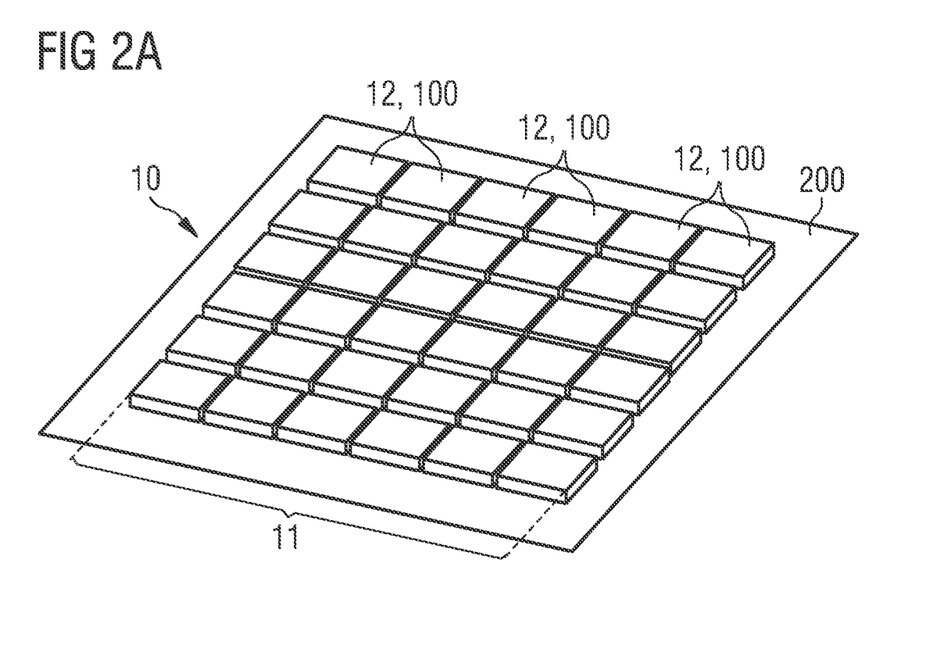
Figure 2B:
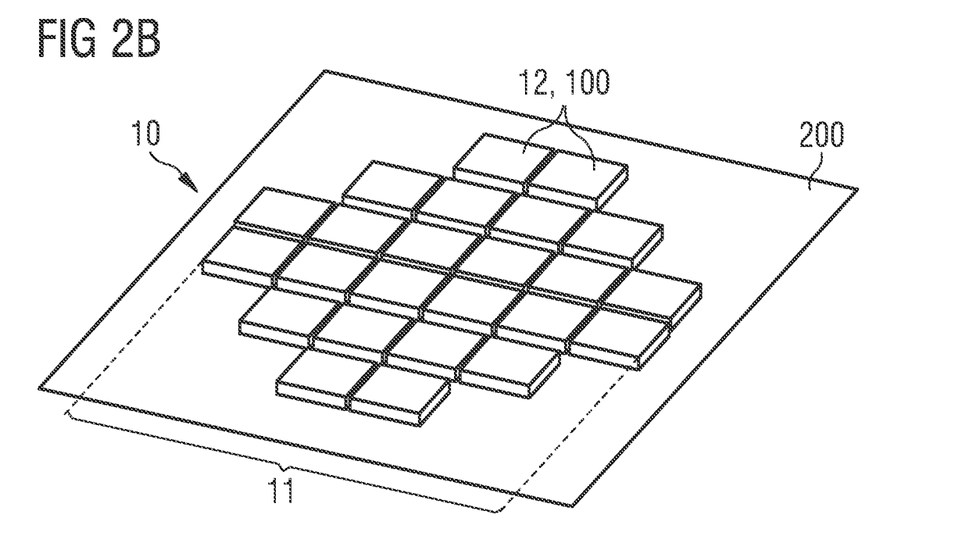

As shown in FIGS. 2A and 2B, the semiconductor light source 10 can comprise a plurality of light-emitting semiconductor chips 100 which are independently operable, each single emitter 12 being formed by a semiconductor chip 100. The plurality of semiconductor chips 100 can be mounted and electrically connected on a connection carrier 200 such as a printed circuit board as shown. The connection carrier 200 can also have a previously described control device or parts thereof. Furthermore, the plurality of the semiconductor chips 100 can be laterally surrounded by a common molded body, in particular a plastic body which can be produced by a molding process, the molded body being molded onto the semiconductor chips 100 and forming a plate-like composite carrier with the light-emitting semiconductor chips 100 attached therein.

The single emitters 12 preferably each have a single luminous surface of less than or equal to 2 $mm^2$ or preferably less than or equal to 1 $mm^2$ or particularly preferably less than or equal to 0.6 $mm^2$. Each of the single emitters 12 can have a substantially Lambertian radiation characteristic as described above.

The single emitters 12 are preferably arranged in a matrix arrangement, i.e. in a two-dimensional arrangement of a plurality of single emitters 12, wherein the single emitters 12 can comprise single luminous surfaces, preferably with a square, rectangular or hexagonal shape. The semiconductor light source 10 accordingly has a total luminous surface which is formed by the arrangement form of the single luminous surfaces. In particular, the total luminous surface has an extension of less than or equal to 2 cm in all lateral directions, so that the total luminous surface can be particularly preferably less than or equal to 2 cm×2 cm. As shown in FIG. 2A, the matrix arrangement and thus the shape of the total luminous surface 11 can be square, for example. Furthermore, rectangular or hexagonal shapes are also conceivable. Other matrix arrangements are also possible, one of which is shown in FIG. 2B as an example. This arrangement approximates the total luminous surface 11 to a circular or elliptical arrangement.

Figure 2C:
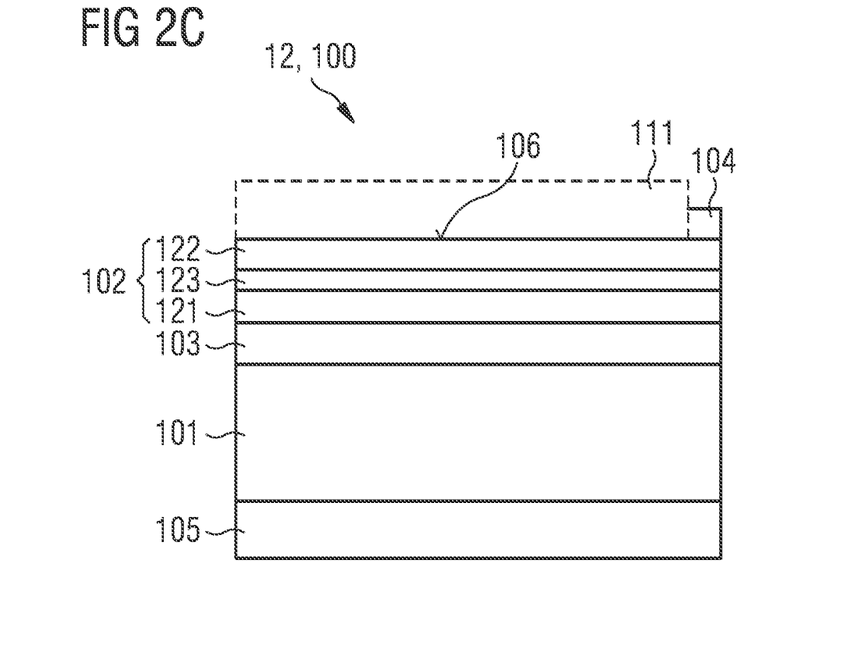
Figure 2D:
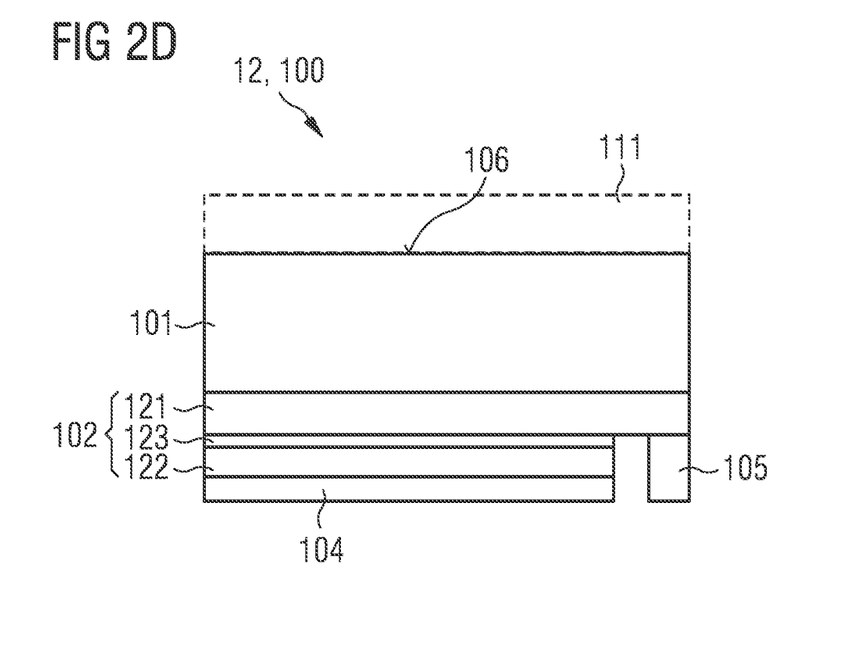

FIGS. 2C and 2D show two embodiments of light-emitting semiconductor chips 100. As shown in FIG. 2C, a light-emitting semiconductor chip 100 can be a light-emitting diode chip with a semiconductor layer sequence 102 deposited on a substrate 101. Purely as an example, two semiconductor layers 121, 122 are shown, between which an active layer 123 is located, which is embodied and intended to generate light during operation of the light-emitting semiconductor chip 100. Depending on the desired emission wavelength, the semiconductor layer sequence 102 can comprise or be made of one or more of the semiconductor materials described above in the general part. The light generated during operation is emitted via the single luminous surface 106.

The semiconductor layer sequence 102 can be epitaxially deposited on a growth substrate and after epitaxial growth can be transferred to a carrier substrate like the substrate 101 shown. The substrate 101 can thereby comprise or be made of a semiconductor material, for example a compound semiconductor material mentioned in the general part, or another suitable material. In particular, a growth substrate and/or the substrate 101 can comprise or be made of, for example, sapphire, GaAs, GaP, GaN, InP, SiC, Si and/or Ge.

The semiconductor layer sequence 102 can have as active layer 123 for example a conventional pn junction, a double heterostructure, a single quantum well structure (SQW structure) or a multiple quantum well structure (MQW structure). In addition to the active layer 123, the semiconductor layer sequence 102 can comprise further functional layers and functional regions indicated by layers 121, 122, such as p- or n-doped charge carrier transport layers, undoped or p- or n-doped confinement, cladding or waveguide layers as well as barrier layers, planarization layers, buffer layers and/or protective layers and combinations thereof. Furthermore, a mirror layer 103 can be arranged between the substrate 101 and the semiconductor layer sequence 102, as shown in FIG. 2C. In addition, additional layers, such as buffer layers, barrier layers and/or protective layers, can also be arranged perpendicular to the growth direction of the semiconductor layer sequence 102, for example around the semiconductor layer sequence 102, i.e. for example on the lateral surfaces of the semiconductor layer sequence 102. Furthermore, it can also be possible for the semiconductor chip 100 to be laterally surrounded by a molding compound formed by a plastic material, which can give the semiconductor chip 100 stability.

For the electrical contacting of the semiconductor layer sequence 102 and thus for injecting current into the active layer 123, electrical contacts 104, 105 in the form of electrode layers or electrode structures are provided, the positions of which shown on the semiconductor layer sequence 102 and on the side of the substrate 101 facing away from the semiconductor layer sequence 102 are to be understood purely as examples.

The light-emitting semiconductor chip 100 shown in FIG. 2C represents the basic structure of a so-called thin-film light-emitting diode chip, in which the semiconductor layer sequence 102 is transferred from a growth substrate to a suitable carrier substrate after growth, and in which the growing substrate is subsequently removed or at least thinned. Alternatively, the semiconductor chip 100 can also have the growth substrate as substrate 101, in which case the mirror layer 103 can be omitted. Such a light-emitting semiconductor chip, which is mounted on a carrier with the growth substrate, can also be described as a so-called volume emitter.

FIG. 2D shows a light-emitting semiconductor chip 100, which is embodied as a so-called flip chip. The flip chip is mounted on a carrier with the electrical contacts 104, 105, so that light generated during operation is emitted through the substrate 101, which can be the growth substrate. Otherwise, the semiconductor chip 100 shown in FIG. 2D can have features as described in connection with FIG. 2C.

For the production of white light, it can also be advantageous if, as indicated in FIGS. 2C and 2D, the single emitters 12 comprise a wavelength conversion element 111 which is arranged on the respective single luminous surface 106 and which is part of the respective single emitter 12. Here, a wavelength conversion element 111 can be applied, as indicated, to an individual single luminous surface 106. Alternatively, it is also possible that a wavelength conversion element is applied to a group of single luminous surfaces or together to all single luminous surfaces of the semiconductor light source. It is particularly advantageous when the single emitters 12 comprise the respective or common wavelength conversion element, as shown, directly on the single illuminated surface 106.

Figure 3A:
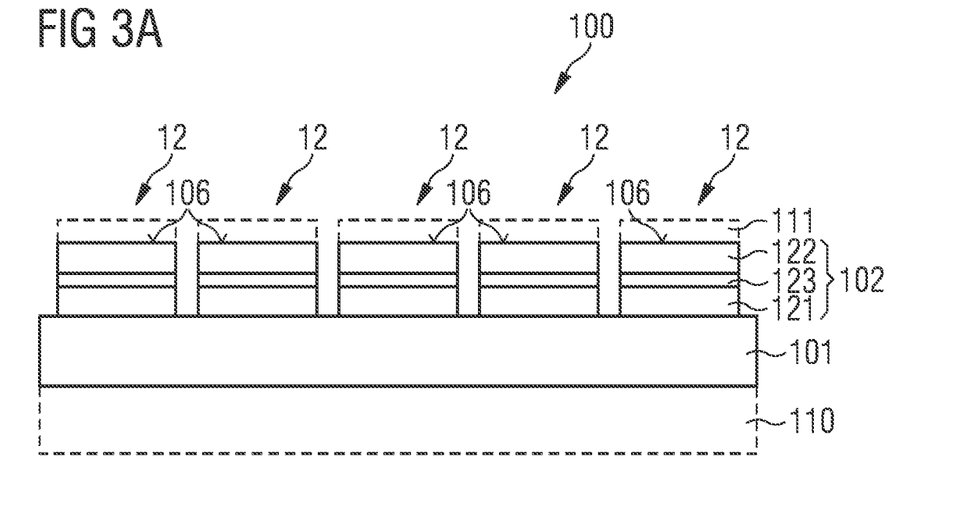
Figure 3B:
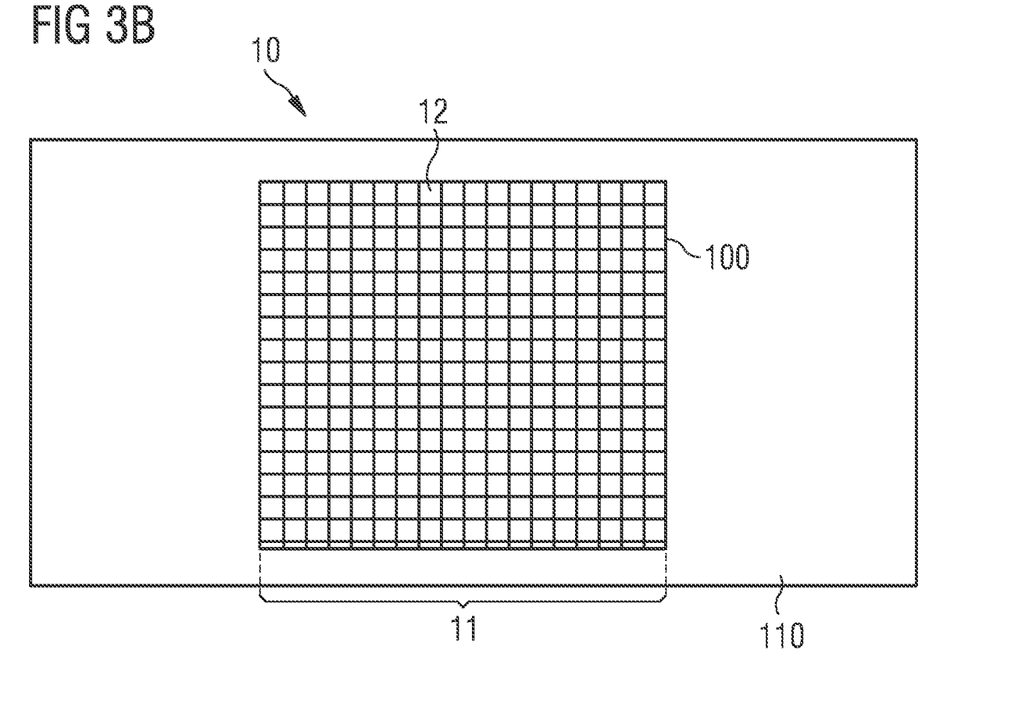
Figure 3C:
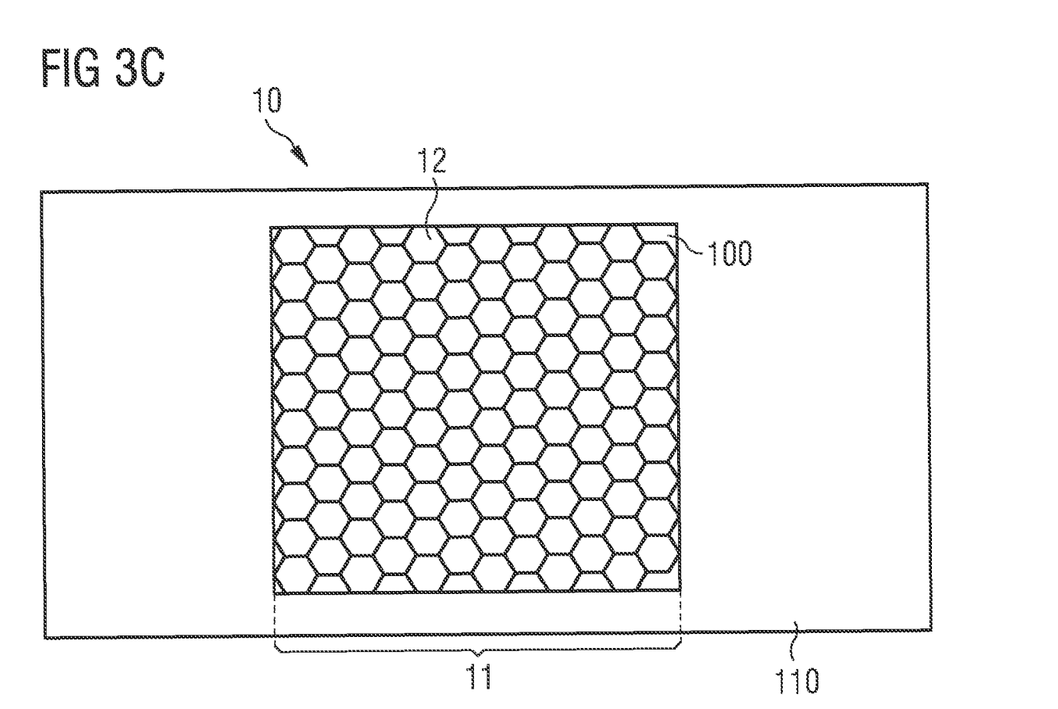

FIGS. 3A to 3C show further embodiments for semiconductor light sources 10 and single emitters 12. In comparison to the previous embodiments, the semiconductor light source 10 in these embodiments comprises a light-emitting semiconductor chip 100 with a plurality of independently operable light segments that form the plurality of single emitters 12. A correspondingly segmented light-emitting semiconductor chip 100 is formed as a segmented light-emitting diode and has a segmented formation of at least part of the semiconductor layer sequence 102. In other words, the semiconductor layer sequence 102 on the substrate 101, which can be a growth or carrier substrate, is divided into individual, individually operable light-emitting segments which form the plurality of individually operable single emitters 12. Generally, the semiconductor chips 100 shown in FIGS. 3A to 3C can have features as described in connection with the previous figures. For the sake of clarity, electrical contacts are not shown. The single emitters 12 formed by light segments can be switched on and off and can be dimmable independently of each other as in the case of single emitters formed by semiconductor chips. For the single control of the single emitters 12, the substrate 101 can optionally be mounted on a control device 110 formed by a driver circuit carrier which is indicated by the dotted line in FIG. 3A and which comprises, for example, a suitable driver circuit or at least a part thereof. The control device 110 can, for example, be based on silicon technology. Segmented light-emitting diodes are described, for example, in the documents US 2015/0325598 A1 and US 2015/0333047 A1, the respective disclosure content of which is hereby fully incorporated by reference.

As can be seen in FIGS. 3B and 3C, the light segments light-emitting of the semiconductor chip 100, which form the single emitters 12, can have single luminous surfaces, for example, with a square or hexagonal shape. Due to the defocused arrangement of the optical element, a hexagonal shape of the single luminous surfaces can produce an approximately circular image of the single emitters 12. In addition, other shapes are also possible.

As shown in the embodiments described, the single emitters 12 are arranged next to each other in the lateral direction, i.e. parallel to a main extension plane of the single luminous surfaces of the single emitters 12. By activating all single emitters simultaneously, the entire lighting region to be illuminated by the light source can be illuminated. Partial regions of the lighting region illuminated by adjacent single emitters 12 can partially overlap, especially at the blurred edges.

In connection with FIGS. 4A to 4D, a further embodiment of a light source 1 is shown in conjunction with simulations and measurements of the effect of the optical element 20. The light source 1 purely exemplary comprises a semiconductor light source 10 in the form of a segmented light-emitting semiconductor chip, as described in connection with FIGS. 3A and 3B, with a square matrix of 32×32 single emitters and a total luminous surface of 4 mm×4 mm. In the embodiment shown, the light-emitting semiconductor chip emits blue light which is partially converted into yellow light by a wavelength conversion element so that the semiconductor light source 10 emits white light.

Figure 4A:
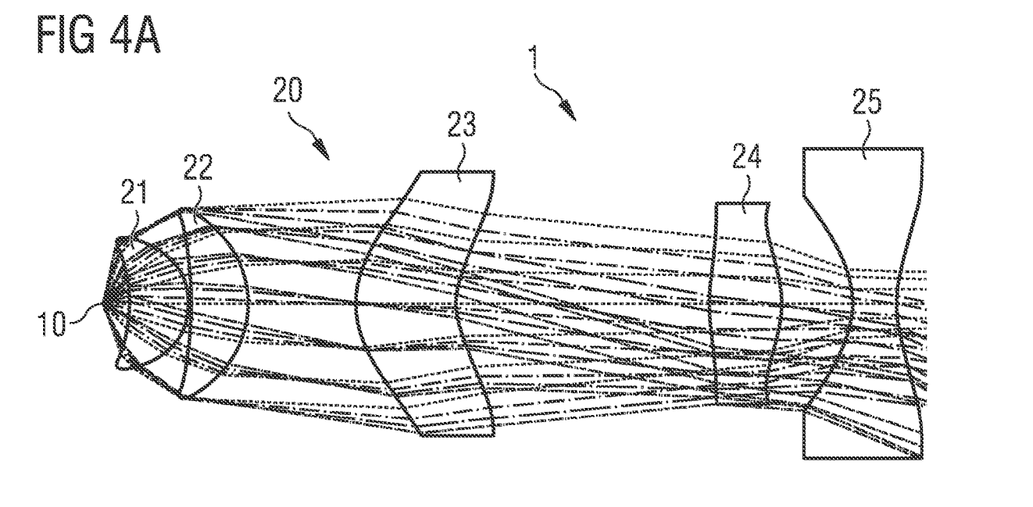
FIGS. 4A to 4D show schematic illustrations of a light source according to a further embodiment in connection with simulations and measurements.

In the embodiment shown, the optical element 20 has several lenses 21, . . . , 25, wherein the entirety of the lenses is embodied in such a way that the previously described light directing properties are achieved. Thus, the optical element 20 is a refractive optical element which, with regard to its optical properties, consists of the lenses, so that no further optical components are present in addition to the lenses shown and the optical properties of the optical element 20 are given by the lenses alone. In the embodiment shown, the optical element 20 has rotationally symmetrical lenses and overall dimensions of about 120 mm in length and 50 mm in diameter.

The lens 21 forming the input lens, whose surface facing the semiconductor light source 10 forms the light-incoupling surface of the optical element 20, comprises, in the direction of radiation, a concave and a convex spherical surface and is preferably made of glass. The acceptance angle of the light-incoupling surface is greater than or equal to 60°. In order to achieve the most efficient light incoupling into the optical element 20, the distance between the light-incoupling surface of the optical element 20 and the single luminous surfaces of the single emitters is greater than or equal to 0.1 mm and less than or equal to 10 mm. Calculations have shown that a light-incoupling surface with an acceptance angle of greater than or equal to 60° and such a distance leads to an overall efficiency of more than 75%. Downstream of the lens 21 is an aspherical lens 22 made of a cyclo-olefin polymer, also with a concave and a convex surface. Lenses 21 and 22 are followed in the direction of radiation by an aspherical lens 23 with a convex and a concave surface, a biconvex aspherical lens 24 and a biconcave aspherical lens 25, whose surface remote from the semiconductor light source 10 forms the light-outcoupling surface of the optical element 20. At the same time, the light-outcoupling surface of the optical element 20 can be the light-outcoupling surface of the light source 1. Lenses 23, 24 and 25 are preferably made of plastic such as polymethyl methacrylate (PMMA) or a cyclo-olefin polymer. In addition to the optical element 20, the light source 1 does not require any other optical components such as lenses or mirrors or apertures. According to an alternative embodiment, all lenses can also be spherical and made of glass.

The optical element 20 is embodied such that the light of each single emitter of the semiconductor light source 10 is directed into a respective solid angle region and the solid angles assigned to the single emitters are all in pairs at least partially different. Accordingly, the light of each single emitter is directed into a specifically assigned solid angle region and each solid angle region overlaps at most partially with each of the other solid angle regions, so that a different region of a surface can be illuminated with each single emitter. The optical element 20 comprises at least partially a wide-angle optic-like and/or a fisheye optic-like mode of imaging. Particularly preferably, all solid angle regions have substantially a same size, so that each of the single emitters can illuminate an associated region on a surface and the region areas have substantially the same size.

Figure 4B:
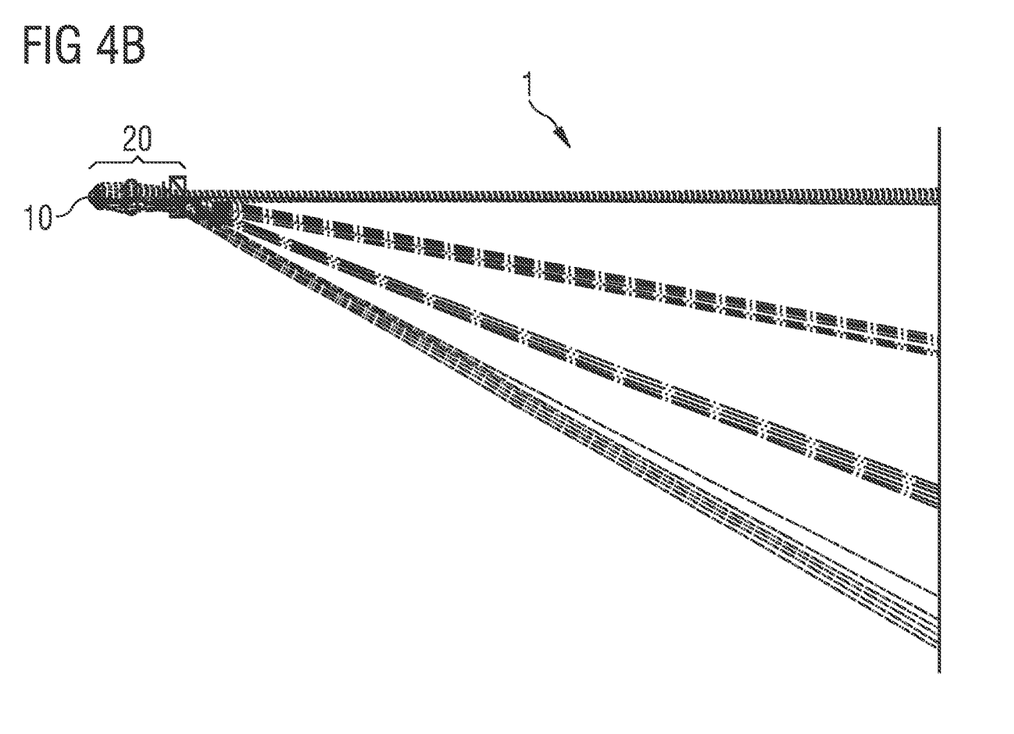

FIGS. 4A and 4B show ray tracing of light from four selected single emitters directly after the light-outcoupling surface of the optical element (FIG. 4A) and up to a distance of about 1 m (FIG. 4B). The described deflection of light from the individual single emitters into assigned solid angle regions is clearly visible.

Figure 4C:
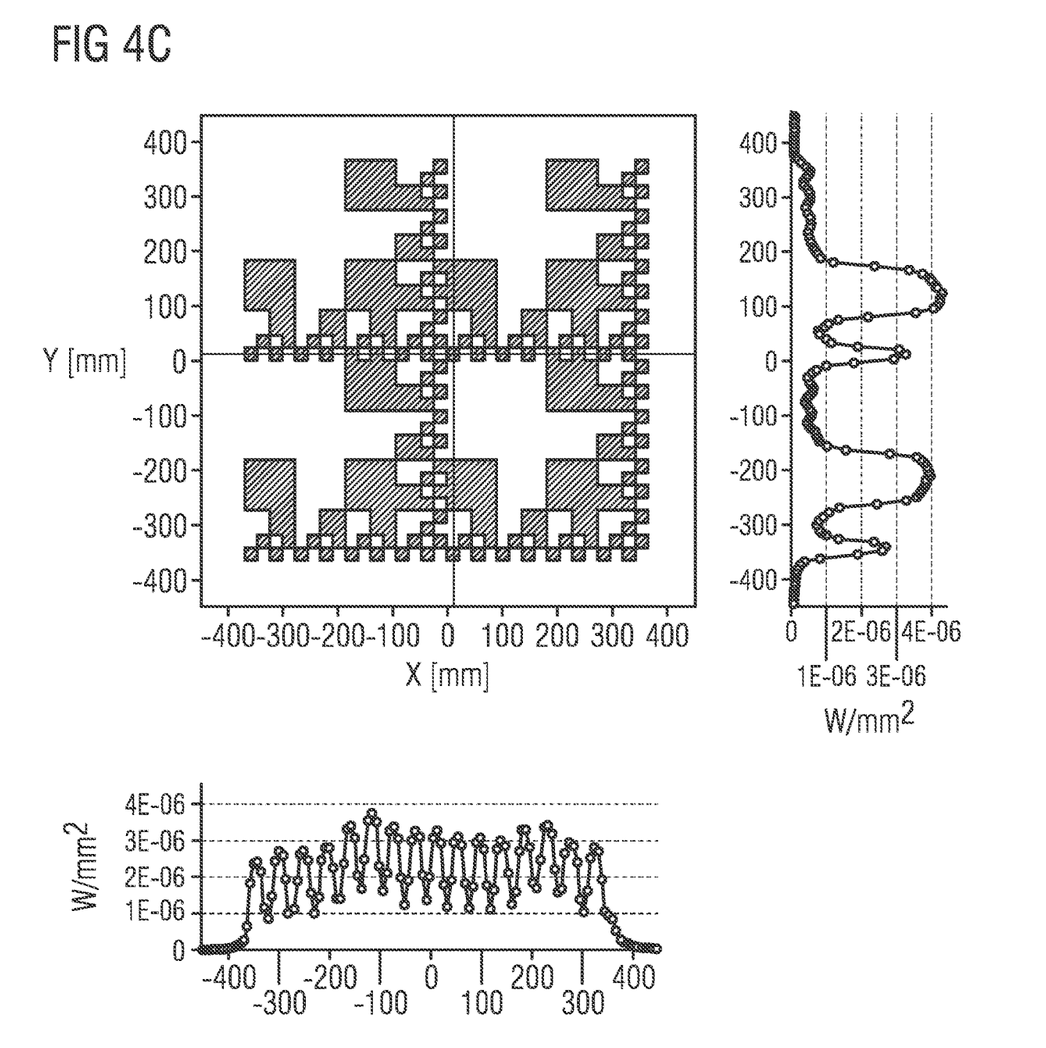
Figure 4D:
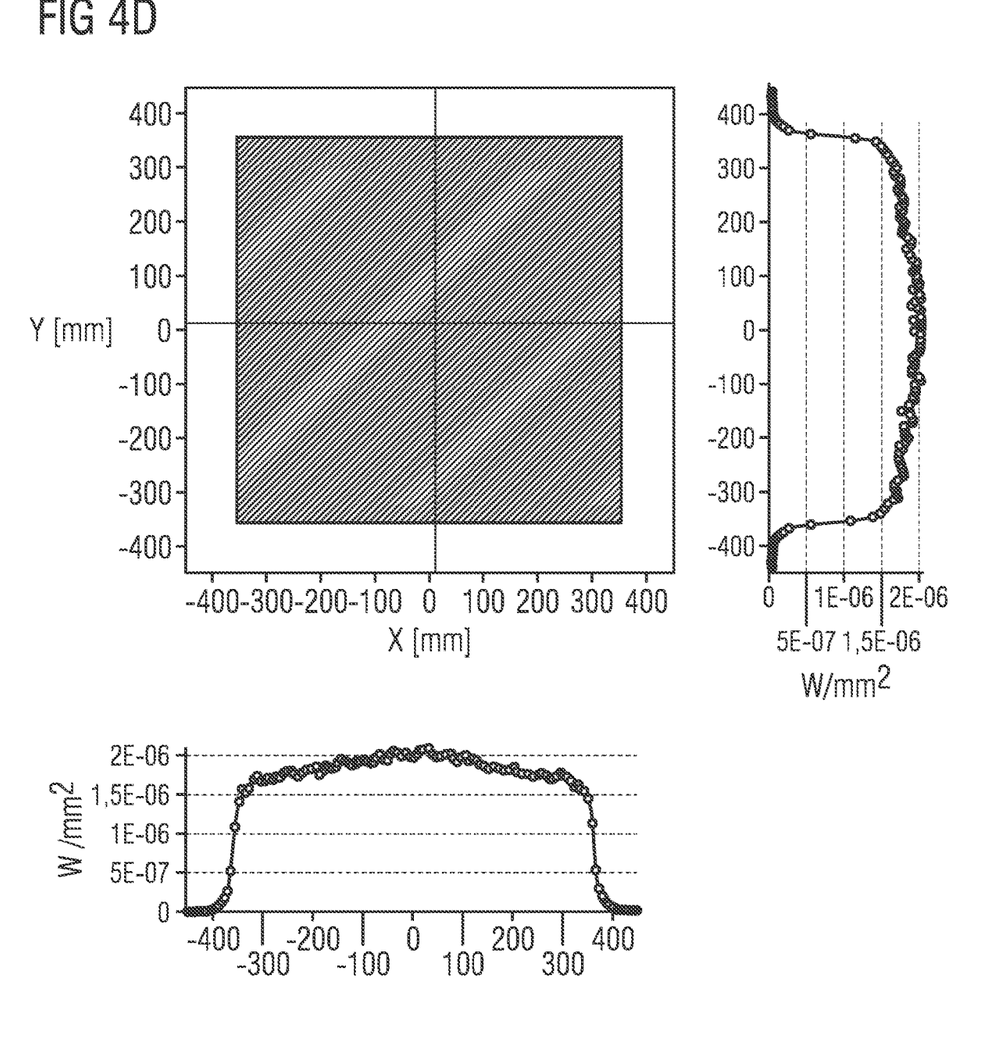

FIGS. 4C and 4D show the intensity distributions of emitted light at a distance of 1 m, wherein, in the case of FIG. 4C, not all single emitters of the semiconductor light source were operated, and wherein, in the case of FIG. 4D, the total luminous surface of the semiconductor light source was fully illuminated by the operation of all single emitters. The intensity diagrams correspond to horizontal and vertical sections through the perpendicular bisectors. The total luminous surface of the semiconductor light source 10, i.e. the light of all jointly operated single light sources, is emitted as described in connection with FIG. 1 in a light cone which has a full aperture angle of greater than or equal to 60° and preferably greater than or equal to 90° and less than or equal to 160° and preferably less than or equal to 120°.

By using rotationally symmetrical lenses, it can be achieved that the optical element directs the total luminous surface into an illumination region with an approximately identical shape. Correspondingly, the total luminous surface and the illumination region can, for example, each have a square shape as shown, or alternatively another shape such as a rectangular, hexagonal or other polygonal or approximately round shape. Since the single emitters are arranged defocused to the optical element and the single luminous surfaces are correspondingly blurred, the shape of the illumination region can be somewhat blurred compared to the total luminous surface. Alternatively, the total luminous surface and the illumination region can also have different shapes. For this purpose, the optical element can, for example, have one or more cylindrical lenses or lenses with a cylindrical-lens-like imaging pattern, so that light from a for example square total luminous surface is directed into an elliptical or rather rectangular illumination region. This can be advantageous for the illumination of rectangular rooms, for example.

Figure 5A:
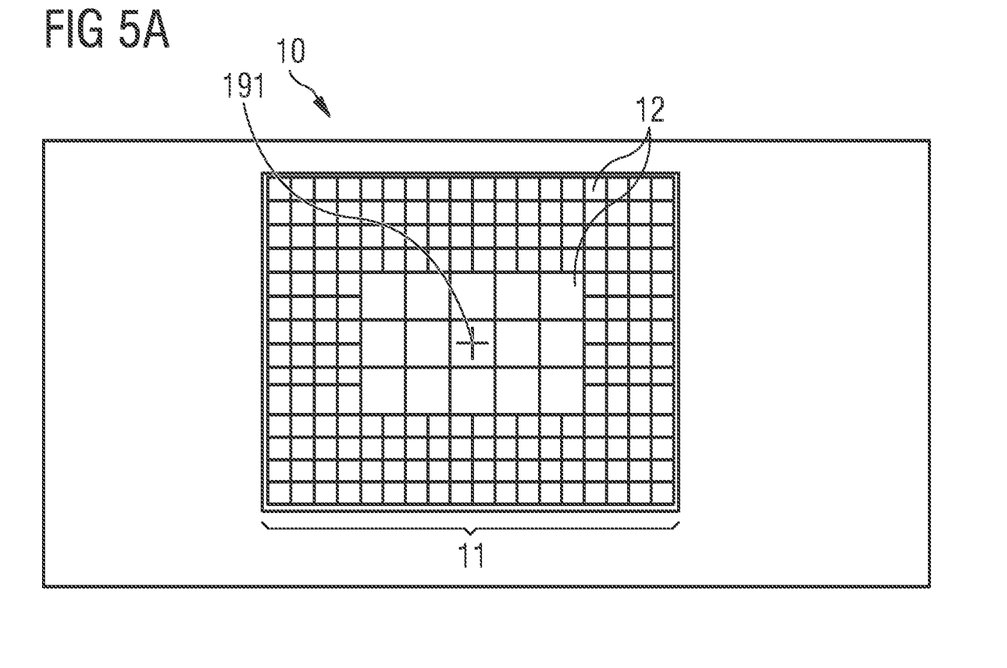
Figure 5B:
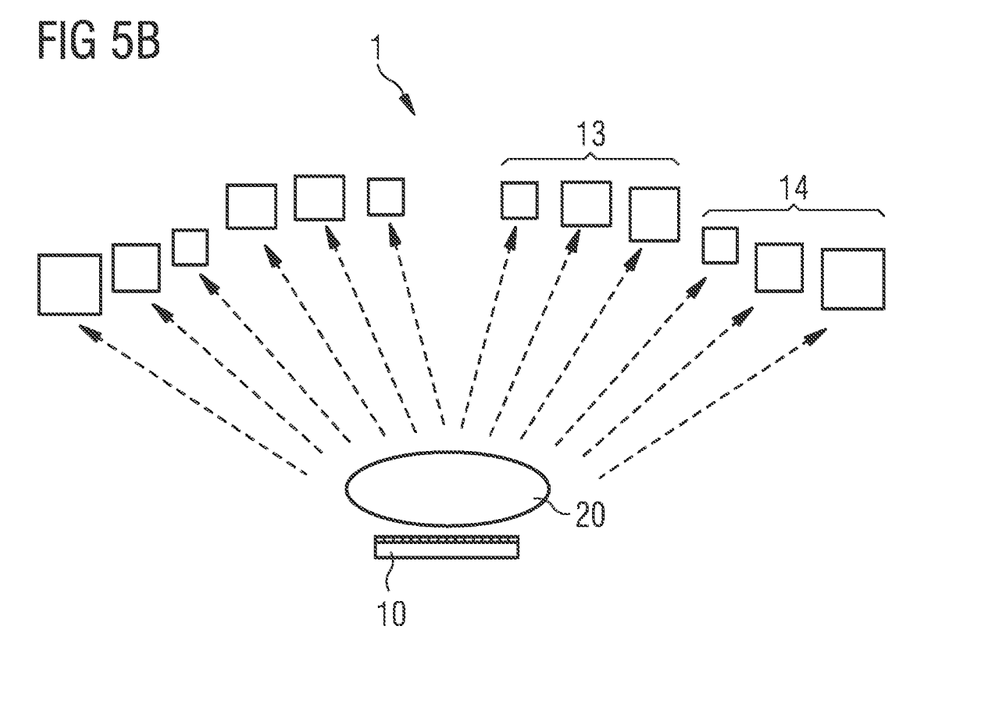

As an alternative to the embodiments shown so far, in which the single emitters all have single luminous surfaces of the same size, the single luminous surfaces can also be embodied differently, in particular with different sizes. FIG. 5A shows a semiconductor light source 10 according to an embodiment in which the totality of the single emitters 12 form a total luminous surface 11 with a center point 191 indicated by the cross, wherein a group of first single emitters with a first distance from the center point and a group of second single emitters with a second distance from the center point are present and the first and second single emitters have single luminous surfaces of different sizes from one another. Here, the first distance is smaller than the second distance, so that the first single emitters with a larger single luminous surface are arranged closer to the center than the second single emitters. As indicated in FIG. 5B, the optical element 20 can be embodied in such a way that the image of the single luminous surfaces is slightly distorted, so that the projection of single luminous surfaces is the greater the further away they are from the center of the total luminous surface. FIG. 5B shows a first group 13 of projected first single luminous surface and a second group 14 of projected second single luminous surface. As can be seen, this effect can be at least partially compensated for by using smaller second single luminous surface further away from the center of the total luminous surface.

It is also possible to achieve an inverse size distribution of the single luminous surfaces, particularly when used with a negative-distorting optical element that images smaller those single luminous surfaces which are further outside located. By such a combination a similar or equal intensity and similar or equal imaging cones can be achieved.

Furthermore, the optical element can also be embodied in such a way that the distortion of the optical element is such that single luminous surfaces near or in the middle of the total luminous surface are projected further toward the outside and thus no longer appear so large. In this way, it is possible to achieve that all single luminous surfaces are imaged into approximately similar solid angles, so that a room can be illuminated with such a light source as with a classical light source.

Figure 6:
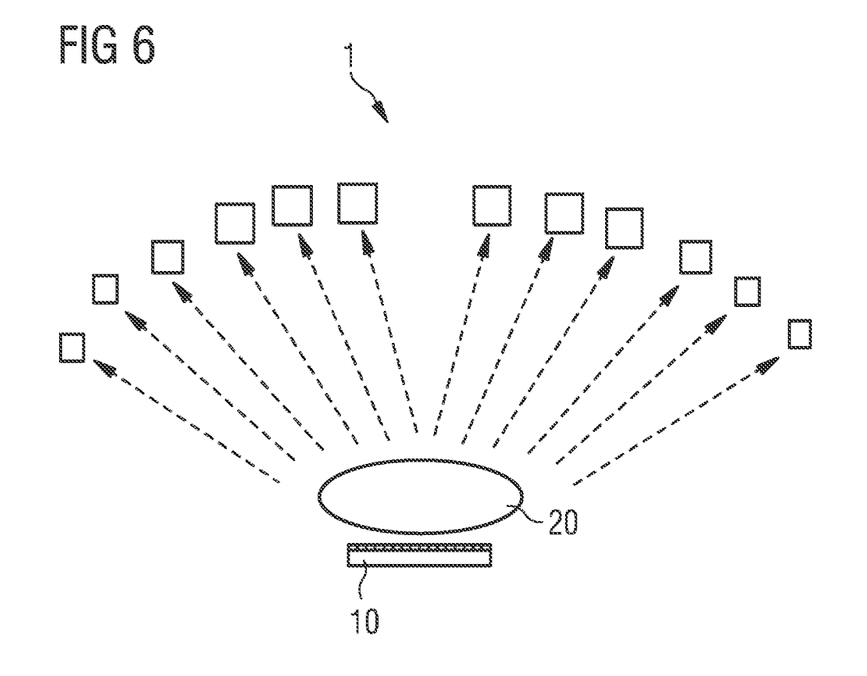

Furthermore, the optical element can also be embodied in such a way that single luminous surfaces near or in the middle of the total luminous surface are projected considerably further toward the outside. In this way it is possible to achieve that the images of the single luminous surfaces are smaller at large angles, as indicated in FIG. 6. Correspondingly, single luminous surfaces located further to the outside can be projected into smaller solid angles, which can result in finer granular illumination on the walls of a room or, in the case of larger rooms, the same granularity at greater distances.

The features and embodiments described in connection with the figures can also be combined with one another according to further embodiments, even if not all such combinations are explicitly described. Furthermore, the embodiments described in connection with the figures can alternatively or additionally have further features according to the description in the general part.

The invention is not limited by the description based on the embodiments to these embodiments. Rather, the invention includes each new feature and each combination of features, which includes in particular each combination of features in the patent claims, even if this feature or this combination itself is not explicitly explained in the patent claims or embodiments.

LIST OF REFERENCE SIGNS

1 light source
10 semiconductor light source 11 total luminous surface
12 single emitter
13, 14 group
20 optical element
21, 22, 23, 24, 25 lens
100 light-emitting semiconductor chip
101 substrate
102 semiconductor layer sequence
103 mirror layer
104, 105 electrical contact
106 single luminous surface
110 control device
111 wavelength conversion element
121, 122 semiconductor layer
123 active layer
191 center point
200 connection carrier

The invention claimed is:

1. Light source, comprising
a planar semiconductor light source having a plurality of independently operable single emitters, each of the single emitters emitting light via a respective single luminous surface during operation, and
a common optical element arranged directly downstream of the single emitters, which is embodied and intended for directing light from different single emitters into different solid angle regions, wherein the single emitters are arranged defocused relative to the optical element and the single luminous surfaces are imaged in a blurred manner by the optical element;
wherein the light source illuminates a lighting region, and partial regions of the lighting region illuminated by adjacent single emitters partially overlap, and
wherein the light of each single emitter is directed into a specially assigned solid angle region and each solid angle region overlaps at most partially with each of the other solid angle regions.

2. The light source according to claim 1, wherein the semiconductor light source comprises a light-emitting semiconductor chip having a plurality of independently operable luminous segments, each single emitter being formed by a luminous segment.

3. The light source according to claim 1, wherein the semiconductor light source comprises a plurality of light-emitting semiconductor chips operable independently of each other, each single emitter being formed by a semiconductor chip.

4. The light source according to claim 1, wherein each single emitter comprises a single luminous surface of less than or equal to 2 mm$^2$.

5. The light source according to claim 1, wherein each of the single emitters comprises Lambertian radiation characteristics.

6. The light source according to claim 1, wherein at least two or more single emitters have single luminous surfaces being different to each other.

7. The light source according to claim 6, wherein a first group having a plurality of first single emitters and a second group having a plurality of second single emitters are present.

8. The light source according to claim 1, wherein a totality of the single emitters forms a total luminous surface with a center point, at least one first single emitter with a first distance from the center point and at least one second single emitter with a different second distance from the center point are present, and the first and second single emitters have single luminous surfaces of different sizes.

9. The light source according to claim 8, wherein the first distance is smaller than the second distance and the first single emitter has a larger single luminous surface than the second single emitter.

10. The light source according to claim 1, wherein the single emitters are arranged in an orthogonal matrix or in a hexagonal matrix.

11. The light source according to claim 1 wherein the optical element images the light of each single emitter into a respective solid angle and all solid angles have an equal size.

12. The light source according to claim 1, wherein the optical element at least partially has a wide angle optic-like and/or fisheye optic-like imaging pattern.

13. The light source according to claim 1, wherein a totality of the single emitters has a total luminous surface of square, rectangular or polygonal shape.

14. The light source according to claim 1, wherein the optical element emits a total luminous surface into a light cone having a full aperture angle greater than or equal to 60° and less than or equal to 160°.

15. The light source according to claim 1, wherein the optical element has a light-incoupling surface which has a distance of greater than or equal to 0.1 mm and less than or equal to 10 mm from each of the single luminous surfaces of the single emitters.

16. The light source according to claim 1, wherein the optical element has an acceptance angle greater than or equal to 60°.

17. The light source according to claim 1, wherein the optical element comprises a plurality of lenses.

18. Light source, comprising
a planar semiconductor light source having a plurality of independently operable single emitters, each of the single emitters emitting light via a respective single luminous surface during operation; and
a common optical element arranged directly downstream of the single emitters, which is embodied and intended for directing light from different single emitters into different solid angle regions, wherein the single emitters are arranged defocused relative to the optical element and the single luminous surfaces are imaged in a blurred manner by the optical element;
wherein a totality of the single emitters forms a total luminous surface with a center point, at least one first single emitter with a first distance from the center point and at least one second single emitter with a different second distance from the center point are present, and the first and second single emitters have single luminous surfaces of different sizes, wherein the first distance is smaller than the second distance and the first single emitter has a larger single luminous surface than the second single emitter.

19. Light source, comprising
a planar semiconductor light source having a plurality of independently operable single emitters, each of the single emitters emitting light via a respective single luminous surface during operation; and
a common optical element arranged directly downstream of the single emitters, which is embodied and intended for directing light from different single emitters into different solid angle regions, wherein the single emitters are arranged defocused relative to the optical element and the single luminous surfaces are imaged in a blurred manner by the optical element;

wherein the light source illuminates a lighting region, and partial regions of the lighting region illuminated by adjacent single emitters partially overlap, and wherein a totality of the single emitters forms a total luminous surface with a center point, at least one first single emitter with a first distance from the center point and at least one second single emitter with a different second distance from the center point are present, and the first and second single emitters have single luminous surfaces of different sizes.

* * * * *